(12) United States Patent
Otsuka et al.

(10) Patent No.: US 8,217,466 B2
(45) Date of Patent: Jul. 10, 2012

(54) HIGH-SPEED SEMICONDUCTOR DEVICE AND METHOD FOR MANUFACTURING THE SAME

(75) Inventors: Kanji Otsuka, Higashiyamato (JP); Fumio Mizuno, Hino (JP); Munekazu Takano, Hino (JP); Tamotsu Usami, Kokubunji (JP)

(73) Assignee: Jjtech Co., Ltd., Kanagawa (JP)

( * ) Notice: Subject to any disclaimer, the term of this patent is extended or adjusted under 35 U.S.C. 154(b) by 779 days.

(21) Appl. No.: 11/990,491

(22) PCT Filed: Aug. 1, 2006

(86) PCT No.: PCT/JP2006/315221
§ 371 (c)(1),
(2), (4) Date: Feb. 15, 2008

(87) PCT Pub. No.: WO2007/020796
PCT Pub. Date: Feb. 22, 2007

(65) Prior Publication Data
US 2009/0096029 A1    Apr. 16, 2009

(30) Foreign Application Priority Data
Aug. 18, 2005  (JP) ................ 2005-237253

(51) Int. Cl.
H01L 21/70 (2006.01)
(52) U.S. Cl. .............. 257/369; 257/E29.066; 438/197
(58) Field of Classification Search .............. 257/369, 257/E29.066; 438/197
See application file for complete search history.

(56) References Cited

U.S. PATENT DOCUMENTS

| | | | |
|---|---|---|---|
| 6,731,153 B2 | 5/2004 | Otsuka et al. | |
| 2004/0046216 A1* | 3/2004 | Iwamatsu et al. | 257/405 |

FOREIGN PATENT DOCUMENTS

| | | |
|---|---|---|
| JP | 04-280474 | 10/1992 |
| JP | 07-326757 | 12/1995 |
| JP | 2002-124635 | 4/2002 |
| JP | 2005-101515 | 4/2005 |
| JP | 2005101515 A * | 4/2005 |

OTHER PUBLICATIONS

International Search Report issued Oct. 3, 2006 in the International (PCT) Application of which the present application is the U.S. National Stage.

* cited by examiner

*Primary Examiner* — Thao Le
*Assistant Examiner* — Matthew Gordon
(74) *Attorney, Agent, or Firm* — Wenderoth, Lind & Ponack, LLP (57) ABSTRACT

Disclosed is a semiconductor device wherein the switching speed of a transistor is increased. Specifically disclosed is a semiconductor device comprising a semiconductor layer formed on a part of an insulating layer, a first transistor formed on a lateral face of the semiconductor layer and having a first gate insulating film, a first gate electrode and two first impurity layers forming a source and a drain, and a second transistor formed on another lateral face of the semiconductor layer and having a second gate insulating film, a second gate electrode and two second impurity layers forming a source and a drain.

11 Claims, 6 Drawing Sheets

HIGH-SPEED SEMICONDUCTOR DEVICE AND METHOD FOR MANUFACTURING THE SAME

TECHNICAL FIELD

The present invention relates to a semiconductor device and manufacturing method thereof. In particular, the present invention relates to a semiconductor device in which the switching speed of transistors are enhanced, and its manufacturing method.

BACKGROUND ART

Figure 8:
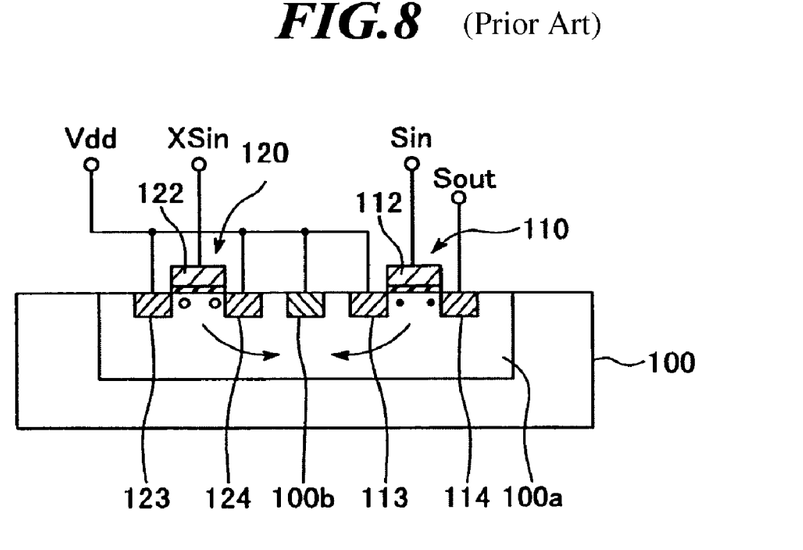
FIG. 8 is a cross-sectional view for illustrating a configuration of a conventional semiconductor device.

FIG. 8 is a view for illustrating a configuration of a conventional semiconductor device. In the figure, in a p-type silicon layer 100, an n-type well 100a is formed. In the n-type well 100a, an n-type impurity layer 100b is formed, and through the n-type impurity layer 100b, a voltage Vdd is applied to the n-type well 100a.

In the n-type well 100a, a p-type MOS transistor 110 and a p-type MOS varactor 120 are arranged neighboring each other. The voltage Vdd is applied to a source 113 of the p-type MOS transistor 110 and also to a source 123 and a drain 124 of the p-type MOS varactor 120.

A signal $S_{in}$ is applied to a gate electrode 112 of the p-type MOS transistor 110, and a differential signal $XS_{in}$ of the signal $S_{in}$ is input into a gate electrode 122 of the p-type MOS varactor 120. For this reason, when the p-type MOS transistor 110 is switched from ON state to OFF state or from OFF state to ON state, electric charges (for example, electrons) which have been accumulated in the channel region of the p-type MOS transistor 110 and electric charges (for example, holes) which have been accumulated in the channel region of the p-type MOS varactor 120 are exchanged. For this reason, the p-type MOS transistor 110 switches in a higher speed as compared to that of a case without p-type MOS varactor 120 (for example, refer to Patent Document 1).

Patent Document 1: Japanese Patent Laid Open No. 2002-124635 (FIG. 2)

SUMMARY OF THE INVENTION

Problem to be Solved by the Invention

If a transistor having an enhanced switching speed than that of the transistor having the configuration mentioned above is realized, the operational speed of the semiconductor device will be enhanced further.

The present invention is performed in consideration of the situation as mentioned above, and an object thereof is to provide a semiconductor device in which the switching speed of transistors are enhanced, and its manufacturing method.

Means for Solving the Problem

In order to achieve the above mentioned object, a semiconductor device according to the present invention, includes:

a semiconductor layer formed on a part of an insulating layer;

a first transistor formed on a first region of a side surface of the semiconductor layer, and having a first gate insulating film, a first gate electrode, a first source impurity layer, and a first drain impurity layer;

a second transistor which is formed on a second region of a side surface of the semiconductor layer, the second region facing the first region through the semiconductor layer, and which has a second gate insulating film, a second gate electrode, a second source impurity layer, and a second drain impurity layer; and a well formed in the semiconductor layer, being common to the first transistor and the second transistor.

In the semiconductor device, a case in which a first signal is input into the first gate electrode, and a second signal that is an inversion signal of the first signal, is input into the second gate electrode will be considered. In this case, the electric charges (for example, holes) accumulated in the channel region of the first transistor and the electric charges (for example, electrons) accumulated in the channel region of the second transistor, have mutually reversed polarities. For this reason, when the first transistor is in ON state, the second transistor acts as a varactor, and when the second transistor is in ON state, the first transistor acts as a varactor.

In addition, when the first transistor is switched from ON state to OFF state, the electric charges accumulated in the channel region of the first transistor and the electric charges accumulated in the channel region of the second transistor are exchanged through the well. The same goes for a case when the first transistor is switched from OFF state to ON state.

Moreover, the first region in which the first transistor is formed, and the second region in which the second transistor is formed, face each other through the semiconductor layer. For this reason, the moving distance of the electric charges when the electric charges are exchanged, will be shorter as compared to that of the conventional example mentioned above.

Accordingly, the switching speed of each of the first transistor and the second transistor will be higher as compared to that of the conventional example mentioned above.

Moreover, since electric charges having being accumulated in each of the channel regions of the first transistor and the second transistor are exchanged when the transistors are switched, the electric charges are reused without going outside the semiconductor layer. Therefore, the power consumption of the first transistor and the second transistor will be small.

In addition, although the first gate electrode and the second gate electrode are, for example, polysilicon electrodes, they may be metal electrodes.

It is preferable for the thickness of the semiconductor layer sandwiched between the first gate insulating film and the second gate insulating film to be not more than 0.35 fμE, where, f indicates the clock frequency (1/s) of the semiconductor device, μ indicates the mobility (cm²/sV) of the holes of the semiconductor device, and E indicates the maximum value of field intensity (V/cm) of each of the channels under the first gate insulating film and the second gate insulating film.

Although, it is preferable for the first gate insulating film and the second gate insulating film to be arranged at positions facing each other through the semiconductor layer, they may be arranged at positioned which are shifted from the above positions, respectively.

The first source impurity layer and the second source impurity layer may be connected to each other so as to form one impurity layer. In this case, the thickness of a part of the semiconductor layer, at which the first source impurity layer and the second source impurity layer are located may be thinner than that of a part of the semiconductor layer, at which the first drain impurity layer and the second drain impurity layer are located.

When the first source impurity layer and the second source impurity layer are arranged at positions facing each other through the semiconductor layer and the first drain impurity layer and the second drain impurity layer are arranged at positions facing each other through the semiconductor layer, the semiconductor layer may have a first oxide layer sandwiched between the first source impurity layer and the second source impurity layer, and a second oxide layer sandwiched between the first drain impurity layer and the second drain impurity layer. In this case, since among the capacitances of the first transistor and the second transistor, the capacitances originating from the source impurity layer and the drain impurity layer, respectively, will be small, the power consumption will be smaller.

The semiconductor layer has a shape of, for example, an approximate rectangular parallelepiped. In this case, the first region is a first side surface of the approximate rectangular parallelepiped, and the second region is an opposite surface of the first side surface. It is preferable for the first side surface and the opposite surface to be a side surface in a lengthwise direction.

The manufacturing method of a semiconductor device according to the present invention includes the steps of:

forming an approximate rectangular parallelepiped semiconductor layer on a part of a first insulating layer, the semiconductor layer being doped with impurities and acting as a well;

forming a first gate insulating film on a first side surface of the semiconductor layer, and a second gate insulating film on a second side surface of the semiconductor layer;

forming a first gate electrode located on the first gate insulating film, and a second gate electrode located on the second gate insulating film; and forming the first source impurity layer and the first drain impurity layer on the first side surface, and the second source impurity layer and the second drain impurity layer on the second side surface.

The manufacturing method of a semiconductor device according to the present invention may further include the step of:

forming an upper insulating layer located on the semiconductor layer in between the step of forming the semiconductor layer and the step of forming the first and second source impurity layers and the first and second drain impurity layers, and the step of forming the first and second source impurity layers and the first and second drain impurity layers is a step of doping the semiconductor layer with impurities using the first gate electrode, the second gate electrode, and the upper insulating layer as masks.

Another manufacturing method a semiconductor device according to the present invention may include the steps of:

forming an approximate rectangular parallelepiped semiconductor layer on a part of a first insulating layer, the semiconductor layer being doped with impurities and acting as a well;

forming a gate insulating film of a first transistor on a first side surface of the semiconductor layer, and a gate insulating film of a second transistor on a second side surface that is a surface facing the first side surface;

forming a gate electrode of the first transistor on the gate insulating film of the first transistor, and a gate electrode of the second transistor, which is located at a position facing the gate electrode of the first transistor, on the gate insulating film of the second transistor;

by working a part of the semiconductor layer, forming a thin-walled part in the semiconductor layer, the thin-walled part neighboring to a region sandwiched between the gate electrode of the first transistor and the gate electrode of the second transistor and having a thickness thinner than those of the other parts; and by doping the semiconductor layer with impurities using the gate electrode of the first transistor and the gate electrode of the second transistor as masks, forming a source impurity layer in the entire thin-walled part, the source impurity layer having impurities dispersed therein and acting as a source of the first transistor and a common source of the second transistor, a drain impurity layer of the first transistor on the first side surface, and a drain impurity layer of the second transistor, which is isolated from the drain impurity layer of the first transistor, on the second side surface.

Another manufacturing method a semiconductor device according to the present invention may include the steps of:

forming an approximate rectangular parallelepiped on a part of a first insulating layer, the semiconductor layer being doped with impurities and acting as a well;

forming a gate insulating film of a first transistor on a first side surface of the semiconductor layer, and a gate insulating film of a second transistor on a second side surface that is a surface facing the first side surface;

forming an electrically conductive layer on the gate insulating film of the first transistor, the gate insulating film of the second transistor, the semiconductor layer, and the upper insulating layer;

by patterning the electrically conductive film, forming a gate electrode of the first transistor on the gate insulating film of the first transistor, and a gate electrode of the second transistor, which is located at a position facing the gate electrode of the first transistor, on the gate insulating film of the second transistor;

forming coating films on a region of the first side surface, on which a drain impurity layer of the first transistor is formed, and a region of the second side surface, on which a drain impurity layer of the second transistor is formed, respectively; and by doping the semiconductor layer with impurities under a condition in which the impurities penetrate through the coating films, with the gate electrode of the first transistor, the gate electrode of the second transistor, and the upper insulating layer as masks, forming a source impurity layer which has the impurities diffused therein from the first side surface to the second side surface and acts as sources of the first and second transistors, respectively, the drain impurity layer of the first transistor on the first side surface, and the drain impurity layer of the second transistor, which is isolated from the drain impurity layer of the first transistor, on the second side surface.

Effects of the Invention

According to the present invention, a semiconductor device operating in a higher speed as compared to that of a conventional semiconductor device, can be provided.

DESCRIPTION OF REFERENCE NUMERALS 1 silicon substrate
2 silicon oxide film
10 n-type silicon layer
10a, 10b side surface
10c thin-walled part
11, 14 silicon oxide layer
12 silicon film
13 silicon oxide film
20, 30 p-type MOS transistor
21, 31 gate insulating film
22, 32 gate electrode
23, 24, 33, 34 p-type MOS transistor
25, 26, 35, 36 AL alloy wiring
100 p-type silicon layer
100a n-type well
100b n-type impurity layer
110 p-type MOS transistor
112, 122 gate electrode
113, 123 source
120 p-type MOS varactor
124 drain

DETAILED DESCRIPTION OF THE INVENTION

Hereinafter, embodiments of the present invention will be described with reference to drawings. FIG. 1(A) is a perspective view of a semiconductor device according to a first embodiment of the present invention, and FIG. 1(B) is a cross-sectional view of FIG. 1(A) cut along a horizontal plane including a line A-A. FIG. 1(C) is a circuit diagram of the semiconductor device shown in FIG. 1(A). The semiconductor device has a configuration in which p-type MOS transistors 20 and 30 are formed on the side surfaces 10a and 10b in the lengthwise direction of an approximate rectangular parallelepiped n-type silicon layer 10, respectively. Into a gate electrode 22 of the p-type MOS transistor 20, a signal S is input, and into a gate electrode 32 of the p-type MOS transistor 30, an inversion signal XS, that is a reversed signal of the signal S, is input. In other words, differential signals are input into the p-type MOS transistors 20 and 30, respectively.

The n-type silicon layer 10 is formed on a silicon oxide film 2 on a silicon substrate 1, and the whole thereof acts as an n-type well in a planar p-type MOS transistor. In other words, the p-type MOS transistors 20 and 30 are formed in the same n-type well. A silicon oxide layer 11 is formed on the top surface of the n-type silicon layer 10. On the side surface 10a of the n-type silicon layer 10, p-type impurity layers 23 and 24 to be a gate insulating film 21, and a source and a drain of the p-type MOS transistor 20, respectively, are formed. A gate electrode 22 is formed on the gate insulating film 21, and Al alloy wirings 25 and 26 are connected to the p-type impurity layers 23 and 24, respectively.

Moreover, on the side surface 10b of the n-type silicon layer 10, p-type impurity layers 33 and 34 to be a gate insulating film 31 and a source and a drain of the p-type MOS transistor 30, respectively, are formed. On the gate insulating film 31, a gate electrode 32 is formed, and on the p-type impurity layers 33 and 34, Al alloy wirings 35 and 36 are formed, respectively.

In addition, the gate electrodes 22 and 32 are, for example, a polysilicon electrode. In this case, it is preferable for the gate electrodes 22 and 32 to be formed with dual doped polysilicon in which both of n-type impurities and p-type impurities are doped. Since this enables a threshold voltage required for operation of the p-type MOS transistors 20 and 30 to be low, it is possible to miniaturize the p-type MOS transistors 20 and 30.

Moreover, the gate electrodes 22 and 32 may be a metal electrode. When the gate insulating films 21 and 31 have been extremely thinned, if the gate electrodes 22 and 32 are formed with polysilicon, depletion layer capacitances generated in the gate electrodes 22 and 32 will be a problem. On the contrary, if the gate electrodes 22 and 32 are made of a metal electrode, such a problem will not occur. In addition, in this case, it is preferable for the material of the gate electrodes 22 and 32 to be a material, such as a metal silicide, in which silicon has a work function near the mid-gap thereof. Moreover, since heat is generated at the time of operation, it is preferable for the material to have heat resistance.

Moreover, the p-type MOS transistors 20 and 30 are arranged at positions facing each other, respectively. More specifically, the gate insulating films 21 and 31, the p-type impurity layers 23 and 33, and the p-type impurity layers 24 and 34 face each other, respectively.

Figure 2:
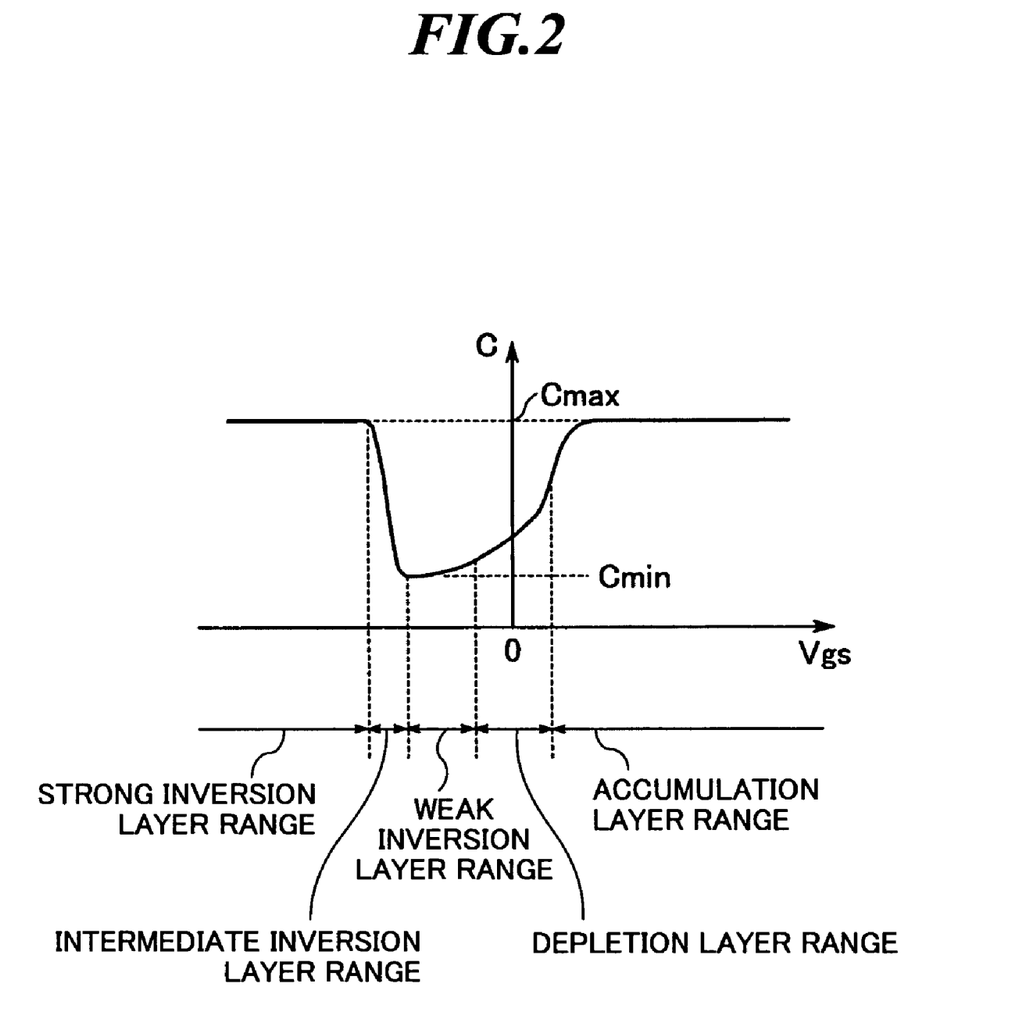
FIG. 2 is a graph illustrating the relationship between voltage $V_{gs}$ between a gate and a source and an amount of electric charges accumulated in a channel region, in a p-type MOS transistor.

FIG. 2 is a graph illustrating the relationship between voltage $V_{gs}$ between a gate and a source in the p-type MOS transistors 20 and 30 and an amount of charges accumulated in channel regions of the p-type MOS transistors 20 and 30. Hereinafter, the p-type MOS transistor 20 will be described as an example. The voltage $V_{gs}$ changes depending on a signal S input into the gate electrode 22.

When the voltage $V_{gs}$ is a negative voltage, an inversion layer having capacitance $C_{ox}$ is formed in a channel region located under the gate insulating film 21. The electric charges accumulated in the inversion layer are holes. Moreover, although a depletion layer is formed under the inversion layer, the depletion layer also has capacitance $C_i$. Moreover, although potential distribution arises in the n-type silicon layer 10 originating from the formation of the inversion layer, the n-type silicon layer 10 has capacitance $C_b$ due to the potential distribution. In this manner, the capacitance C of the p-type MOS transistor 20 is the sum of capacitance $C_{ox}$, $C_i$, and $C_b$. However, the capacitance $C_{ox}$ is dominant.

When the negative value of the voltage $V_{gs}$ is large enough, a strong inversion layer is formed in the p-type MOS transistor 20, and the capacitance C thereof will be a constant value $C_{max}$. In this state, the p-type MOS transistor 20 will be in ON state.

After that, the voltage $V_{gs}$ is raised from the negative potential toward zero potential. Then, holes will be discretized and the inversion layer will be in a weak inversion state from a middle inversion state. This reduces the capacitance C to the minimum value $C_{min}$ thereof. In this state, the p-type MOS transistor 20 will be in OFF state.

Further, as the voltage $V_{gs}$ rises to be a positive potential, next, electrons will be accumulated and the capacitance C will increase. If the positive potential of the voltage $V_{gs}$ will be large enough, the capacitance C of the p-type MOS transistor 20 will be a constant value $C_{max}$. In this state, the p-type MOS transistor 20 is in OFF state, and acts as a varactor.

As described above, when the voltage $V_{gs}$ changes from a negative potential to a positive potential, and the p-type MOS transistor 20 switches from ON state to OFF state, it is necessary for electric charges $Q=2V_s(C_{max}-C_{min})$ to move in a channel region. Where, $V_s$ indicates the amplitude of the voltage $V_{gs}$. The same goes for a case when the voltage $V_{gs}$ changes from a positive potential to a negative potential, and the p-type MOS transistor 20 turns from OFF state into ON state. In addition, this relational expression is also applied to a general MOS transistor.

In a MOS transistor having a general structure, if the frequency of the signal input will be high, there is a case in which the movement of the holes cannot follow the potential change of the signal. In this case, ON/OFF of the MOS transistor is not switched.

On the other hand, as will be described with reference to FIGS. 3(A) to 3(C), in the present embodiment, since differential signals are input into the p-type MOS transistors 20 and 30, respectively, electric charges accumulated in the channel region of the p-type MOS transistor 20 and electric charges accumulated in the p-type MOS transistor 30 are exchanged during switching. Therefore, even if the frequency of the signals is high, ON/OFF is switched.

Figure 3:
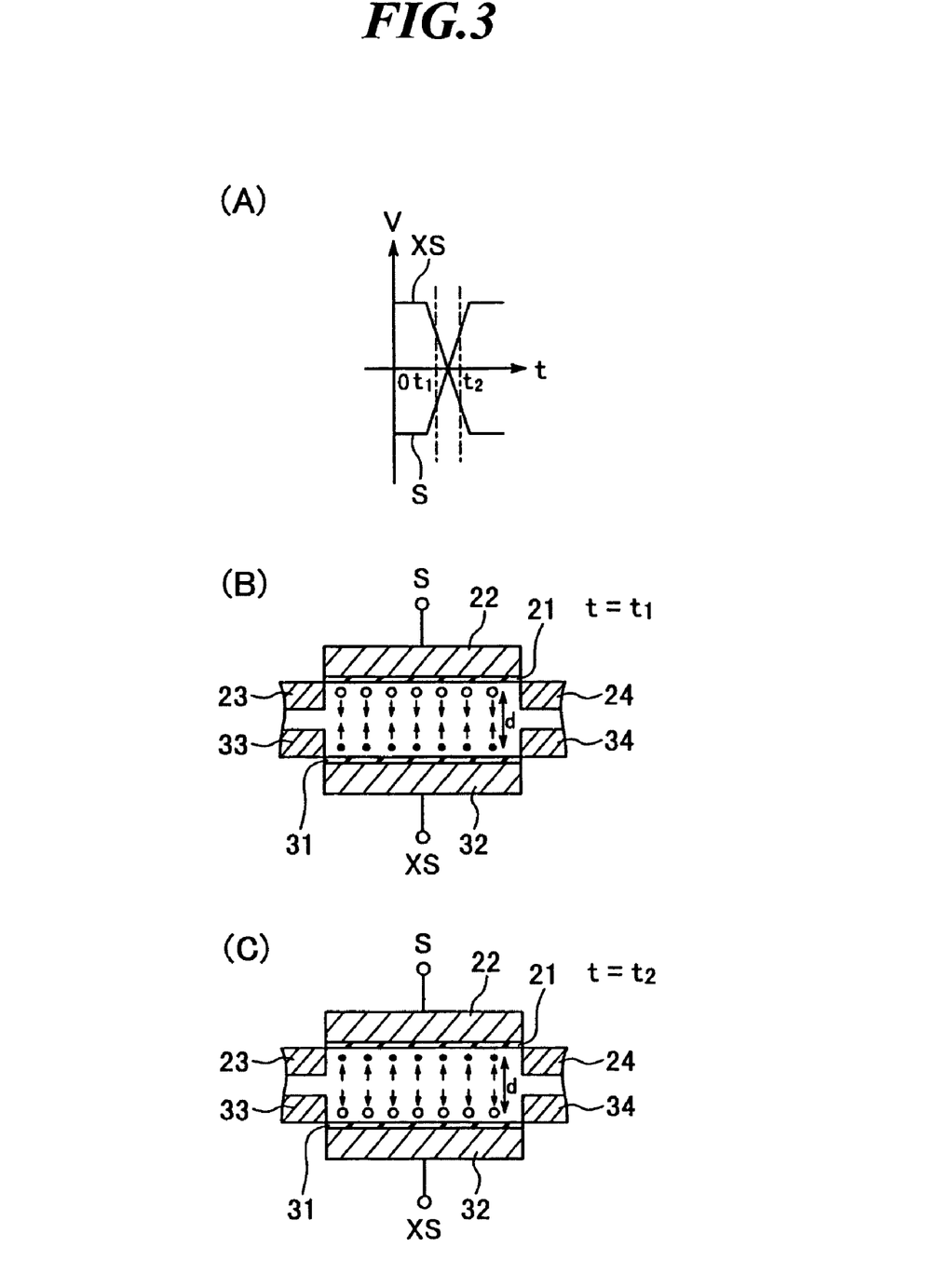
FIG. 3(A) is a view illustrating an example of a signal S input into a gate electrode 22 of a p-type MOS transistor 20 and an inversion signal XS input into a gate electrode 32 of the p-type MOS transistor 30.
FIGS. 3(B) and 3(C) are views illustrating electric charges of the channel regions of the p-type MOS transistors 20 and 30 in cases of t=t1 and t=t2, respectively.

FIG. 3(A) is a view illustrating an example of a signal S input into the gate electrode 22 of the p-type MOS transistor 20 and an inversion signal XS input into the gate electrode 32 of the p-type MOS transistor 30. FIGS. 3(B) and 3(C) are views illustrating electric charges of the channel regions of the p-type MOS transistors 20 and 30 in cases of t=t1 and t=t2, respectively.

As illustrated in FIG. 3(A), at t=0, in a state in which the signal S is in a high-level negative potential, the p-type MOS transistor 20 is in ON state, and holes acting as a career are accumulated in the channel region. In this case, since the inversion signal XS is in a high-level positive potential, the p-type MOS transistor 30 is in OFF state and acts as a varactor, resulting in accumulation of electrons in the channel region.

Then, at t=t1, the signal S is in a falling process from the negative high-level potential to zero potential, and the inversion signal XS is in a falling process from the high-level positive potential to zero potential.

As illustrated in FIG. 3(B), at t=t1, in case of the p-type MOS transistor 20, holes located in the channel region will gradually diffuse, and in case of the p-type MOS transistor 30, electrons located in the channel region will gradually diffuse.

After that, as illustrated in FIG. 3(A), at t=t2, the signal S is in a rising process from zero potential to the high-level positive potential, and the inversion signal XS is in a rising process from zero potential to the high-level negative potential.

As illustrated in FIG. 3(C), at t=t2, holes move to the channel region of the p-type MOS transistor 30, and electrons move to the channel region of the p-type MOS transistor 20. Then, the p-type MOS transistor 20 switches from ON state to OFF state, and acts as a varactor. Moreover, the p-type MOS transistor 30 switches from OFF state to ON state.

As mentioned above, when the p-type MOS transistors 20 and 30 switch, although, the electric charges held by each of the transistors are exchanged, the moving distance of the electric charges at that time is shorter as compared to that in the conventional example (less than the thickness d of the n-type silicon layer 10). Therefore, the p-type MOS transistors 20 and 30 switch in a high speed, respectively.

For example, when μ of holes is equal to $4 \times 10^2$ (cm$^2$/sV, temperature is 300 K, the carrier concentration is $10^{14}$ to $10^{15}$/cm$^3$), and the source voltage is 1.8 V, the drift diffusion rate of the holes will be to $7.2 \times 10^2$ (cm$^2$/s). If distance d is 200 nm under these conditions, the time t necessary for the holes to move distance d will be 0.55 ps from the calculation of the formula: $d=(D \times t)^{0.5}$. Therefore, the p-type MOS transistor 20 can switch from ON state to OFF state in a high-speed of, for example, 350 GHz (t=1 ps is required).

Moreover, since the exchange of the electric charges is performed inside the n-type silicon layer 10, the electric charges do not move outside the semiconductor device. Therefore, the power consumption of the p-type MOS transistors 20 and 30 at the time of switching decreases as compared to that of the conventional one.

Each of the effects mentioned above will be larger as the distance d between the gate insulating films 21 and 31 will be smaller. It is preferable for the distance d to be not more than $t_r \mu E$, that is 0.35 μE/f. Where, $t_r$ indicates the rising time of the signal S, or XS, f indicates the clock frequency (1/s) of the semiconductor device, μ indicates the mobility (cm$^2$/sV) of the holes of the semiconductor device, and E indicates the maximum value of the electric field intensity (V/cm) in each of the channels under the first gate insulating film and the second gate insulating film.

Figure 1:
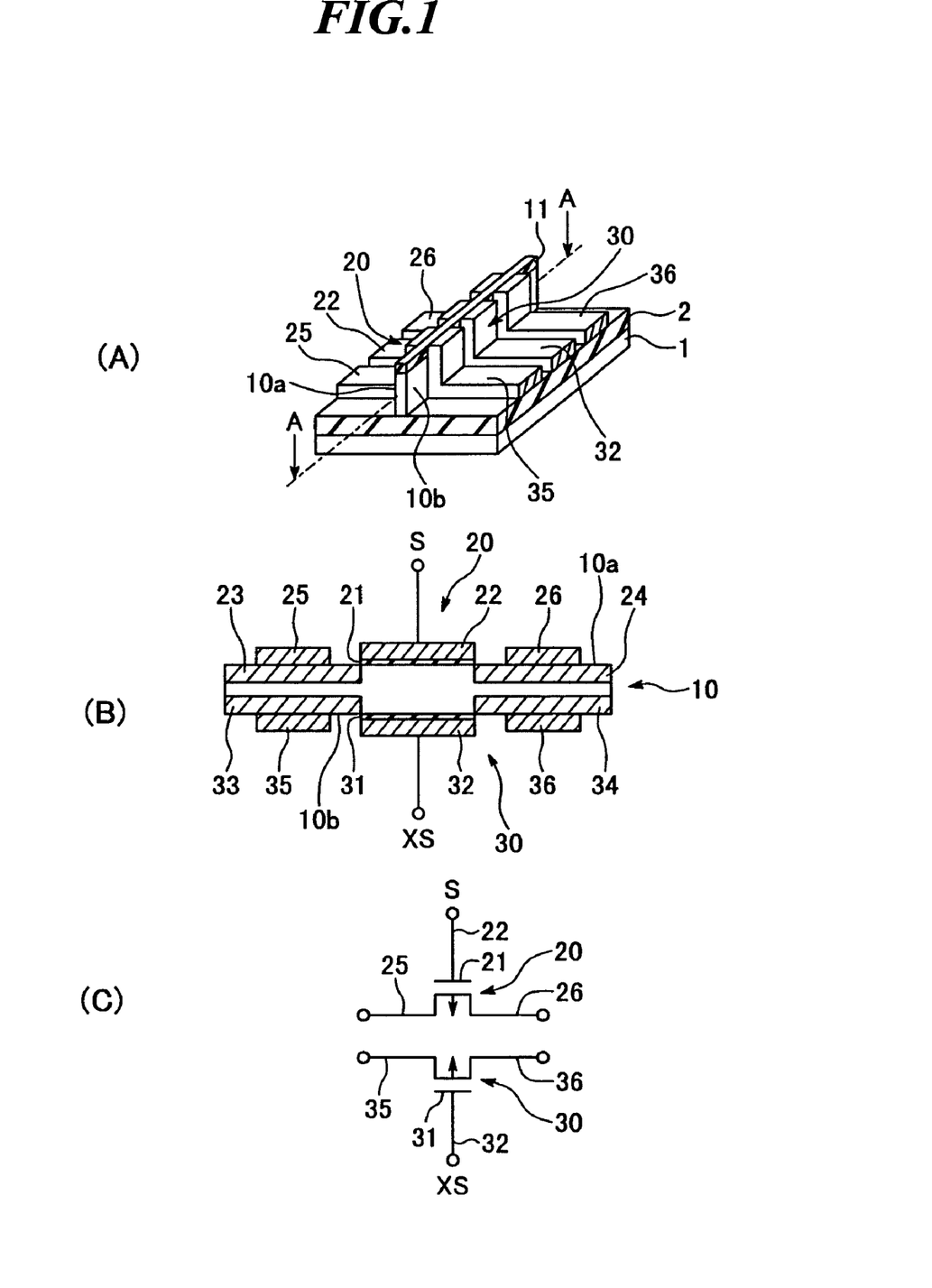
FIG. 1(A) is a perspective view of a semiconductor device according to a first embodiment of the present invention.
FIG. 1(B) is a cross-sectional view of FIG. 1(A) cut along a horizontal plane including a line A-A.
FIG. 1(C) is a circuit diagram of the semiconductor device in FIG. 1(A).
Figure 4:
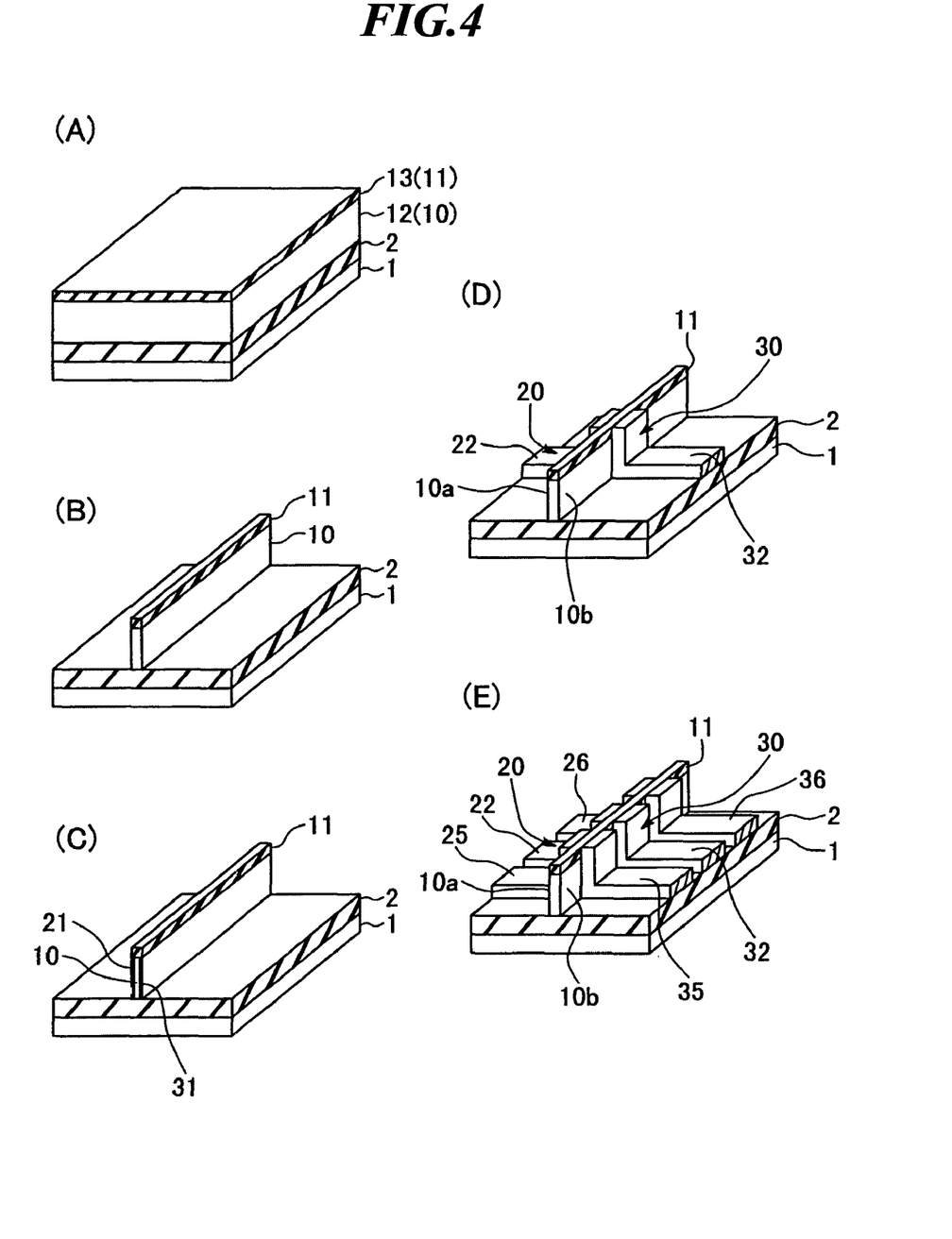
FIG. 4(A) is a perspective view for illustrating a manufacturing method of the semiconductor device shown in FIG. 1.
FIG. 4(B) is a perspective view for illustrating a process next to the process shown in FIG. 4(A)
FIG. 4(C) is a perspective view for illustrating a process next to the process shown in FIG. 4(B)
FIG. 4(D) is a perspective view for illustrating a process next to the process shown in FIG. 4(C)
FIG. 4(E) is a perspective view for illustrating a process next to the process shown in FIG. 4(D).

Each of FIGS. 4(A) to 4(E) is a perspective view for illustrating a manufacturing method of the semiconductor device shown in FIG. 1. First, as shown in FIG. 4(A), a silicon oxide film 2 is formed on a silicon substrate 1 by means of a CVD process, and also a silicon film 12 and a silicon oxide film 13 are laminated on the silicon oxide film 2 by means of the CVD process in this order. The silicon film 12 is a film to be the n-type silicon layer 10, and the silicon oxide film 13 is a film to be the silicon oxide layer 11.

Then, as shown in FIG. 4(B), a photoresist film (not illustrated in figures) is applied on the silicon oxide film 13, and the photoresist film is exposed and developed. Thereby, a resist pattern is formed on the silicon oxide film 13. Then, by using the resist pattern as a mask, the silicon oxide film 13 and the silicon film 12 are etched. Thereby, the silicon oxide film 13 and the silicon film 12 are patterned. Then, the patterned silicon film 12 is doped with n-type impurities. Thereby, the n-type silicon layer 10 and the silicon oxide layer 11 are formed. After that, the resist pattern is removed.

Then, as shown in FIG. 4(C), the n-type silicon layer 10 is thermally oxidized. Thereby, gate insulating films 21 and 31 are formed on the n-type silicon layer 10.

Then, as illustrated in FIG. 4(D), a polysilicon film is formed on the entire surface containing the gate insulating films 21 and 31. Then, a photoresist film is applied on the polysilicon film, and the photoresist film is exposed and developed. Thereby, a resist pattern is formed on the polysilicon film. Then, by using this resist pattern as a mask, the polysilicon film is etched. Thereby, the polysilicon film is patterned, resulting in formation of gate electrodes 22 and 32. After that, the resist pattern is removed.

Then, by means of etching using the gate electrodes 22 and 32 as a mask, the gate insulating films 21 and 31 protruded from the gate electrodes 22 and 32 are removed. Then, using the gate electrodes 22 and 32 as a mask, the n-type silicon layer 10 is doped with p-type impurities. Thereby, the p-type impurity layers 23, 24, 33, and 34 shown in FIG. 1(B) are formed in the n-type silicon layer 10. Here, it is preferable for the distance between the p-type impurity layers 23 and 33 and the distance between the p-type impurity layers 24 and 34 to be equal to or greater than the average value of the fluctuations in the depth of the p-type impurity layers 23, 24, 33, and 34.

Then, as shown in FIG. 4(E), an Al alloy film is formed on the entire surface including the surface of the n-type silicon layer 10 by means of a sputtering process. Then, a photoresist film is applied on the Al alloy film, and the photoresist film is exposed and developed. Thereby, a resist pattern is formed on the Al alloy film. Then, using the resist pattern as a mask, the Al alloy film is etched. Thereby, Al alloy wirings 25, 26, 35, and 36 are formed. After that, the resist pattern is removed.

In this manner, the semiconductor device in FIG. 1 is formed.

As mentioned above, according to the first embodiment of the present invention, the rectangular parallelepiped-like n-type silicon layer 10 is formed, and the p-type MOS transistors 20 and 30 are formed on the side surfaces 10a and 10b of the n-type silicon layer 10, respectively. The n-type silicon layer 10 acts as a common well of the p-type MOS transistors 20 and 30. In addition a signal S is input into the gate electrode 22 of the p-type MOS transistor 20, and an inversion signal XS of the signal S is input into the gate electrode 32 of the p-type MOS transistor 30.

For this reason, electric charges (holes or electrons) accumulated in each of the channel regions of the p type MOS transistors 20 and 30 will have inverse polarities, respectively. Therefore, when the p-type MOS transistors 20 and 30 switch, electric charges accumulated in each of the channel regions are exchanged. Moreover, the side surfaces 10a and 10b are side surfaces in the lengthwise direction of the n-type silicon layer 10, and face to each other. Therefore, the moving distance of the electric charges when they are exchanged will be shorter as compared to that of the conventional example.

For this reason, the switching speeds of the p-type MOS transistors 20 and 30 will be high. Therefore, without using attached circuits, such as ringing prevention circuits (insertion of resistance etc.), a pull-up and pull-down circuit, a push-pro circuit, a threw-rate control circuit, and a PLL circuit, it is possible to provide a semiconductor device (for example, the register and the cache memory of ALU: Arithmetic and Logical Unit) operating in a high speed (for example, at 350 GHz).

Moreover, the electric charges accumulated in the channel region inside the n-type silicon layer 10 will be reused. Therefore, the power consumption of the p-type MOS transistors 20 and 30 will be small.

Figure 5:
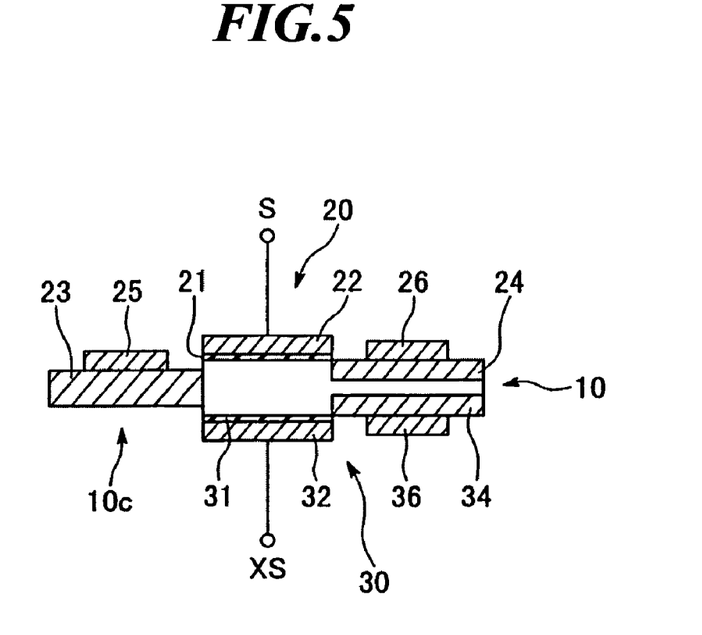
FIG. 5 is a cross-sectional view illustrating a configuration of a semiconductor device according to a second embodiment.

FIG. 5 is a cross-sectional view illustrating the configuration of a semiconductor device according to a second embodiment of the present invention. This figure is a cross-sectional view corresponding to FIG. 1(B) in the first embodiment. In the present embodiment, the portion of the approximate rectangular parallelepiped n-type silicon layer 10, in which impurity layers to be sources of the p-type MOS transistors 20 and 30, respectively, are formed, is caused to be thinner than other regions, resulting in formation of a thin-walled part 10c.

In the thin-walled part 10c, the impurity layers to be the sources of the p-type MOS transistors 20 and 30, respectively, are connected to each other, resulting in formation of one p-type impurity layer 23. For this reason, unlike the first embodiment, it is not necessary for the Al alloy wiring 35 to be formed. Hereinafter, like configurations as those of the first embodiment are denoted by the same reference numerals of the first embodiment, and the descriptions thereof will be eliminated.

The manufacturing method of the semiconductor device according to the present embodiment is the same as that of the first embodiment except for the point in that there is a process of forming the thin-walled part 10c in the n-type silicon layer 10 in between the process of forming the gate electrodes 22 and 32, and the process of forming the p-type impurity layers 23, 24 and 34.

The details of the process in which the thin-walled part 10c is formed in the n-type silicon layer 10 are as follows. First, a photoresist film is applied on the entire surface including the surface of the n-type silicon layer 10, and the photoresist film is exposed and developed. Thereby, a resist pattern is formed on the entire surface including the surface of the n-type silicon layer 10. Then, by using this resist pattern as a mask, the n-type silicon layer 10 is etched. Thereby, the thin-walled part 10c is formed in the n-type silicon layer 10. After that, the resist pattern is removed.

The second embodiment also enables the same effect as that of the first embodiment to be obtained. In addition, the method of forming the thin-walled part 10c is not limited to the above-mentioned example. For example, when the silicon film 12 and the silicon oxide film 13 illustrated in FIGS. 4(A) to 4(E) are pattered to form the n-type silicon layer 10, the thin-walled part 10c may be formed.

Figure 6:
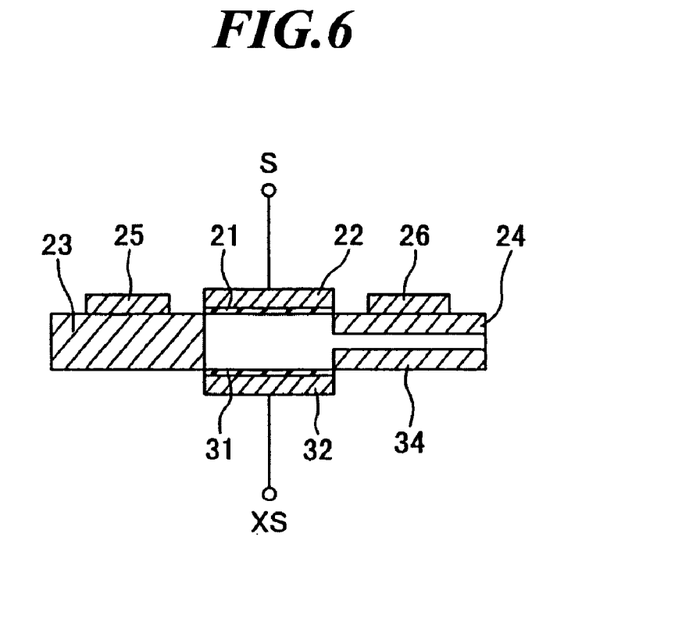
FIG. 6 is a cross-sectional view illustrating a configuration of a semiconductor device according to a third embodiment.

FIG. 6 is a cross-sectional view illustrating the configuration of a semiconductor device according to a third embodiment of the present invention. This figure is a cross-sectional view corresponding to FIG. 1(B) in the first embodiment. The semiconductor device according to the present embodiment has the same configuration as that of the semiconductor device according to the second embodiment, except for a point in that a portion of the n-type silicon layer 10, in which the p-type impurity layer 23 is formed, has the same thickness as those of the other parts. Hereinafter, like configurations as those of the second embodiment are denoted by the same reference numerals in the second embodiment, respectively, and description thereof will be eliminated.

The manufacturing method of the semiconductor device according to the present embodiment is the same as the manufacturing method of the semiconductor device according to the second embodiment except for a point in that there is no process of forming the thin-walled part 10c and details of the process of forming the p-type impurity layers 23, 24 and 34.

In the present embodiment, the details of the process of forming the p-type impurity layers 23, 24 and 34 are as follows. First, a silicon oxide film (not illustrated in figures) is thinly formed on the entire surface including the surface of the n-type silicon layer 10 by means of, for example, a CVD process, and the silicon oxide film is patterned. Thereby, a region of the n-type silicon layer 10, in which the p-type impurity layers 24 and 34 are formed, is covered with a thin silicon oxide film. Then, the n-type silicon layer 10 is doped with impurities by means of thermal diffusion. At that time, the conditions of the thermal diffusion are set so that the impurities penetrate through the thin silicon film. Thereby, the region covered with the silicon oxide film will have a shallower impurity layer than that of the region in which the p-type impurity layer 23 is formed. Thereby, the p-type impurity layers 23, 24 and 34 are formed. After that, the above mentioned silicon oxide film is removed.

The third embodiment also enables the same effect as that of the first embodiment to be obtained.

Figure 7:
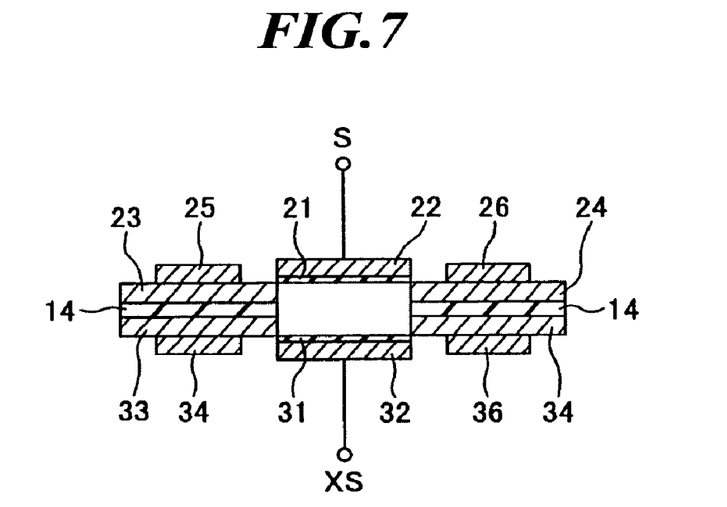
FIG. 7 is a cross-sectional view illustrating a configuration of a semiconductor device according to a fourth embodiment.

FIG. 7 is a cross-sectional view illustrating the configuration of a semiconductor device according to a fourth embodiment of the present invention. This figure is a cross-sectional view corresponding to FIG. 1(B) in the first embodiment. The present embodiment is the same configuration as that of the semiconductor device according to the first embodiment of the present invention except for a point in that a portion sandwiched between the p-type impurity layers 23 and 33, and a portion sandwiched between the p-type impurity layers 24 and 34 of the n-type silicon layers 10 are caused to be a silicon oxide layer 14, respectively. Hereinafter, like configurations as those of the first embodiment are denoted by the same reference numerals, respectively, and the description thereof will be eliminated.

In the first embodiment, as described with reference to FIG. 2, the capacitances C of each of the p-type MOS transistors 20 and 30 will be the sum of a capacitance $C_{ox}$ resulting from an inversion layer, a capacitance $C_i$ resulting from a depletion layer, and a capacitance $C_b$ resulting from the potential distribution in the n-type silicon layer 10. In the present embodiment, since the silicon oxide layer 14 is formed on the n-type silicon layer 10, the capacitance $C_b$ will be smaller as compared to that in the first embodiment.

Therefore, in the present embodiment, not only the same effect as that in the first embodiment, but also an effect enabling the power consumption resulting from the capacitances C of the p-type MOS transistors 20 and 30 to be small can be obtained.

In addition, the present invention is not limited to the embodiments mentioned above, and various changes without departing from the scope of the present invention can be performed. For example, each of the p-type MOS transistors 20 and 30 may be an n-type MOS transistor. In this case, the above-mentioned effects can also be obtained.

Moreover, although the gate insulating films 21 and 31 of the p-type MOS transistors 20 and 30 are arranged at positions facing each other, even when the positions have shifted each other, the above-mentioned effect can be obtained. However, the case in which they are arranged at positions facing to each other enables maximum effects to be obtained.

Moreover, in each of the above mentioned embodiments, although the n-type silicon layer 10 is an approximate rectangular parallelepiped, it may have another shape (a pillar, a cylinder, or a complex). In these cases, the p-type MOS transistors 20 and 30 are arranged at positions facing each other through the main body of the n-type silicon layer 10.

INDUSTRIAL APPLICABILITY

The semiconductor device according to the present invention is applicable to a semiconductor device (for example, the register and cache memory of ALU: Arithmetic and Logical Unit) which is demanded to operate in a high speed (for example, at 350 GHz).

The invention claimed is:

1. A semiconductor device comprising:
a semiconductor layer formed on a part of an insulating layer, said semiconductor layer having a first side surface and a second side surface, a first conductive type impurity region, a second conductive type first source region, a second conductive type second source region, a second conductive type first drain region and a second conductive type second drain region;
a first gate insulating film and a second gate insulating film, respectively formed along a first portion of said first side surface and a first portion of said second side surface so as to face each other through said first conductive type impurity region; and
a first gate electrode and a second gate electrode, respectively formed along said first gate insulating film and said second gate insulating film, wherein,
said second conductive type first and second source regions are respectively formed on both sides of said first conductive type impurity region and are respectively formed along a second portion of said first side surface and a second portion of said second side surface so as to face each other through said first conductive type impurity region,
said second conductive type first and second drain regions are respectively formed on both sides of said first conductive type impurity region and are respectively formed along a third portion of said first side surface and a third portion of said second side surface so as to face each other through said first conductive type impurity region,
said first portion of said first side surface is positioned between said second portion and said third portion of said first side surface,
said first gate insulating film, said first gate electrode, said first source region, and said first drain region constitute a first transistor,
said first portion of said second side surface is positioned between said second portion and said third portion of said second side surface,
said second gate insulating film, said second gate electrode, said second source region, and said second drain region constitute a second transistor,
said first source region and said first drain region connect with a first node as a source electrode and a drain electrode of said first transistor, respectively,
said second source region connects to said first node as a source electrode of said second transistor,
said second drain region connects to a second node as a drain electrode of said second transistor, and
electric charges that have accumulated in a channel region of said first transistor and electric charges that have accumulated in a channel region of said second transistor are exchanged in correspondence with the first transistor and the second transistor being switched to an inverse direction simultaneously with each other.

2. The semiconductor device according to claim 1, wherein,
a first signal is input into said first gate electrode, and
a second signal, that is the inversion signal of said first signal, is input into said second gate electrode.

3. The semiconductor device according to claim 2, wherein,
the first conductive type is n-type, the second conductive type is p-type, and
the thickness of said semiconductor layer sandwiched between said first gate insulating film and said second gate insulating film is not more than 0.35 μE/f, where,
f indicates a clock frequency (1/s) of said semiconductor device, μ indicates a mobility (cm²/sV) of holes of said semiconductor device, and E indicates the maximum value of field intensity (V/cm) of each of channels under said first gate insulating film and said second gate insulating film.

4. The semiconductor device according to claim 1, wherein said first source region and said second source impurity region are connected to each other to form one region.

5. The semiconductor device according to claim 4, wherein the thickness of said semiconductor layer in which said first source region and said second source region are located is thinner than that of said semiconductor layer in which said first drain region and said second drain region are located.

6. The semiconductor device according to claim 3, wherein said semiconductor layer has a shape of an approximate rectangular parallelepiped, said first transistor is located on a first side surface of said approximate rectangular parallelepiped, and said second transistor is located on the opposite surface of said first side surface.

7. A manufacturing method of a semiconductor device, comprising:
forming an approximate rectangular parallelepiped first conductive type semiconductor layer on a part of a first insulating layer, the semiconductor layer being doped with first conductive type impurities and acting as a well;
forming a first gate insulating film on a first side surface of said semiconductor layer, and a second gate insulating film on a second side surface of said semiconductor layer;
forming a first gate electrode located on said first gate insulating film, and a second gate electrode located on said second gate insulating film;
forming a second conductive type first source impurity layer and a second conductive type first drain impurity layer on said first side surface, and a second conductive type second source impurity layer and a second conductive type second drain impurity layer on said second side surface; and
connecting said first source impurity layer, said first drain impurity layer and said second source impurity layer to a first node, and connecting said second drain impurity layer to a second node.

8. The manufacturing method of a semiconductor device according to claim 7, further comprising:
forming an upper insulating layer located on said semiconductor layer in between said forming of said semiconductor layer and said forming of said first and second source impurity layers and said first and second drain impurity layers,
wherein,
said forming of said first and second source impurity layers and said first and second drain impurity layers is comprises doping said semiconductor layer with impurities using said first gate electrode, said second gate electrode, and said upper insulating layer as masks.

9. A semiconductor device comprising:
a semiconductor layer formed on a part of an insulating layer, said semiconductor layer having a first side surface and a second side surface, a first conductive type impurity region sandwiched between a first portion of said first side surface and a first portion of said second side surface facing each other, a second conductive type first source region, a second conductive type second source region, a second conductive type first drain region and a second conductive type second drain region;
a first oxide layer sandwiched between a second portion of said first side surface and a second portion of said second side surface facing each other;
a second oxide layer sandwiched between a third portion of said first side surface and a third portion of said second side surface facing each other;
a first gate insulating film and a second gate insulating film, respectively formed along said first portion of said first side surface and said first portion of said second side surface facing each other through said first conductive type impurity region; and
a first gate electrode and a second gate electrode, respectively formed along said first gate insulating film and said second gate insulating film, wherein,
said second conductive type first and second source regions are respectively formed on both sides of said first oxide layer and are respectively formed along said second portion of said first side surface and said second portion of said second side surface facing each other,
said second conductive type first and second drain regions are respectively formed on both sides of said second oxide layer and are respectively formed along said third portion of said first side surface and said third portion of said second side surface facing each other,
said first portion of said first side surface is positioned between said second portion and said third portion of said first side surface,
said first gate insulating film, said first gate electrode, said first source region and said first drain region constitute a first transistor,
said first portion of said second side surface is positioned between said second portion and said third portion of said second side surface,
said second gate insulating film, said second gate electrode, said second source region and said second drain region constitute a second transistor,
said first source region and said first drain region connect with a first node as a source electrode and a drain electrode of said first transistor, respectively,
said second source region connects to said first node as a source electrode of said second transistor,
said second drain region connects to a second node as a drain electrode of said second transistor, and
electric charges that have accumulated in a channel region of said first transistor and electric charges that have accumulated in a channel region of said second transistor are exchanged in correspondence with the first transistor and the second transistor being switched to an inverse direction simultaneously with each other.

10. The semiconductor device according to claim 1, further comprising:
a first wiring layer and a second wiring layer respectively connected to said first source region and said second source region, said first and second wiring layers facing each other through said first conductive type impurity region and said first and second source regions; and
a third wiring layer and a fourth wiring layer respectively connected to said first drain region and said second drain region, said third and fourth wiring layers facing each other through said first conductive type impurity region and said first and second drain regions.

11. The semiconductor device according to claim 9, further comprising:
a first wiring layer and a second wiring layer respectively connected to said first source region and said second source region, said first and second wiring layers facing each other through said first oxide layer and said first and second source regions; and
a third wiring layer and a fourth wiring layer respectively connected to said first drain region and said second drain region, said third and fourth wiring layers facing each other through said second oxide layer and said first and second drain regions.

* * * * *